United States Patent
Kim

(10) Patent No.: US 8,530,975 B2
(45) Date of Patent: Sep. 10, 2013

(54) SEMICONDUCTOR DEVICE WITH GATE EDGE PROTRUSION

(75) Inventor: Ho-Ung Kim, Ichon-shi (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 13/482,904

(22) Filed: May 29, 2012

(65) Prior Publication Data

US 2012/0235248 A1    Sep. 20, 2012

Related U.S. Application Data

(62) Division of application No. 12/164,072, filed on Jun. 29, 2008, now Pat. No. 8,187,931.

(30) Foreign Application Priority Data

Oct. 8, 2007  (KR) .................. 10-2007-0100723

(51) Int. Cl.
   *H01L 27/088*  (2006.01)
(52) U.S. Cl.
   USPC ..... 257/372; 257/345; 257/401; 257/E29.298
(58) Field of Classification Search
   CPC .................................................. H01L 29/8753
   USPC ......... 257/372, 401, 506, E29.273, E29.274,
              257/E29.298, E21.442, 345, E21.427
   See application file for complete search history.

(56) References Cited

U.S. PATENT DOCUMENTS

| 5,753,951 | A  | * | 5/1998  | Geissler ....................... 257/316 |
| 7,394,116 | B2 | * | 7/2008  | Kim et al. .................... 257/213 |
| 2005/0032322 | A1 | * | 2/2005 | Kim et al. .................... 438/301 |
| 2005/0266638 | A1 | * | 12/2005 | Cho et al. ..................... 438/257 |
| 2006/0177977 | A1 |   | 8/2006 | Chan et al. |
| 2006/0186487 | A1 | * | 8/2006 | Lee ............................. 257/411 |
| 2007/0057325 | A1 |   | 3/2007 | Hsu et al. |

FOREIGN PATENT DOCUMENTS

| KR | 1020060114434 A | 11/2006 |
| KR | 1020060115469 A | 11/2006 |
| KR | 1020070076811 A | 7/2007 |
| KR | 1020070113859 A | 11/2007 |

\* cited by examiner

*Primary Examiner* — Jerome Jackson, Jr.
*Assistant Examiner* — Paul Budd
(74) *Attorney, Agent, or Firm* — Kilpatrick Townsend & Stockton LLP

(57) ABSTRACT

A semiconductor device includes a substrate having an active region and an isolation region, a gate pattern crossing both the active region and the isolation region of the substrate, and a protrusion having a surface higher than that of the substrate over at least an edge of the active region contacting a portion of the isolation region under the gate pattern.

15 Claims, 5 Drawing Sheets

SEMICONDUCTOR DEVICE WITH GATE EDGE PROTRUSION

CROSS-REFERENCE TO RELATED APPLICATIONS

The present invention is a divisional of U.S. patent application Ser. No. 12/164,072, filed on Jun. 29, 2008, which claims priority of Korean patent application number 10-2007-0100723, filed on Oct. 8, 2007, both of which are incorporated by reference in their entirety.

BACKGROUND OF THE INVENTION

The present invention relates to a semiconductor device and a fabricating method thereof, and more particularly, to a semiconductor device that may relieve hot electron induced punchthrough phenomenon even without using a gate tab, and a fabricating method thereof.

Recently, as a design rule of a semiconductor device shrinks to 100 nm or less, an interval between the source and the drain of a transistor narrows and the doping concentrations of the channel, source, and drain increase. Therefore, a phenomena such as a short channel effect (SCE), a hot carrier effect (HCE), and a gate induced drain leakage (GIDL) occur to reduce the electrical characteristics of a transistor.

Particularly, in the case of a positive metal oxide semiconductor (PMOS) transistor formed in a peripheral region, electrons are additionally generated by holes, which are majority carriers. These electrons are trapped into an isolation layer adjacent to an inversion channel of the PMOS transistor, leading to reduction of an effective channel length. The channel inversion caused by trapping of electrons is generated at the edge of an active region contacting a portion of the isolation layer under a gate pattern.

As described above, the undesired channel inversion in the PMOS transistor increases a leakage current during a turn-off operation to increase power consumption, reducing an operating speed, and reducing a breakdown voltage (BV). A phenomenon generating these limitations is generally called a hot electron induced punchthrough (HEIP) phenomenon.

To solve the limitations caused by the HEIP, a technology has been proposed which installs a gate tap at a point where HEIP phenomenon is induced, that is, a boundary region between an active region and an isolation region that overlaps a gate pattern in an aspect of the structure of a semiconductor device.

FIG. 1 illustrates a plan view of a typical semiconductor device having a gate tap.

Referring to FIG. 1, a gate tap 14 is formed at a gate electrode 13 located at the edge of an active region 12 to increase the length of this portion of the gate electrode 13. Therefore, the length W2 of a channel formed at the edge of the active region 12 contacting an isolation region 11 becomes longer than the length W1 of the channel formed at the active region 12, so that the HEIP phenomenon may be relieved.

However, as a channel length reduces as a semiconductor device becomes highly integrated, the length of the gate tap 14 needs to be increased to compensate for the reduced channel length. In this case, the active region 12 needs to be increased to maintain a constant interval between gate electrodes 13 in a region where transistors requiring the gate tap 14 are densely aggregated. This increases a net die size of a semiconductor device. Accordingly, it is difficult to improve the degree of integration of a semiconductor device. Also, when the degree of integration increases, the characteristic of a transistor is difficult to secure.

SUMMARY OF THE INVENTION

Embodiments of the present invention relate to a semiconductor device that may prevent an HEIP phenomenon without using a gate tap, and a fabricating method thereof.

In accordance with an aspect of the present invention, there is provided a semiconductor device. The semiconductor device includes a substrate having an active region and an isolation region, a gate pattern crossing both the active region and the isolation region of the substrate, and a protrusion having a surface higher than that of the substrate over at least an edge of the active region contacting a portion of the isolation region under the gate pattern.

In accordance with another aspect of the present invention, there is provided a method for fabricating a semiconductor device. The method includes forming hard mask patterns over a substrate including an active region and an isolation region, etching the substrate using the hard mask patterns as an etch barrier (or etch mask) to form a protrusion having a higher surface than that of the substrate, forming a gate insulation layer over the substrate including the protrusion, forming a gate conductive layer and a gate hard mask layer over the gate insulation layer, and forming a gate pattern overlapping the protrusion by selectively etching the gate hard mask layer, the gate conductive layer, and the gate insulation layer.

DESCRIPTION OF SPECIFIC EMBODIMENTS

Hereinafter, a semiconductor device and a method for fabricating the same in accordance with the present invention will be described in detail with reference to the accompanying drawings.

Figure 1:
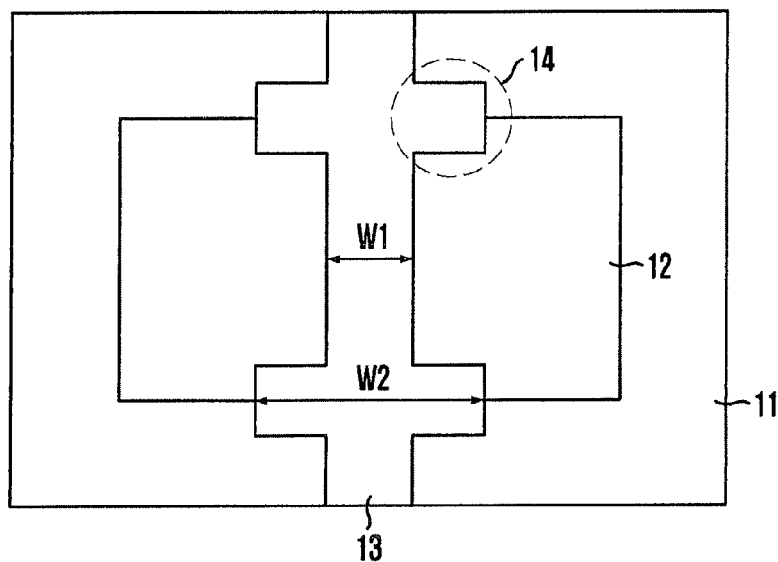
FIG. 1 illustrates a plan view of a typical semiconductor device having a gate tap.
Figure 2A:
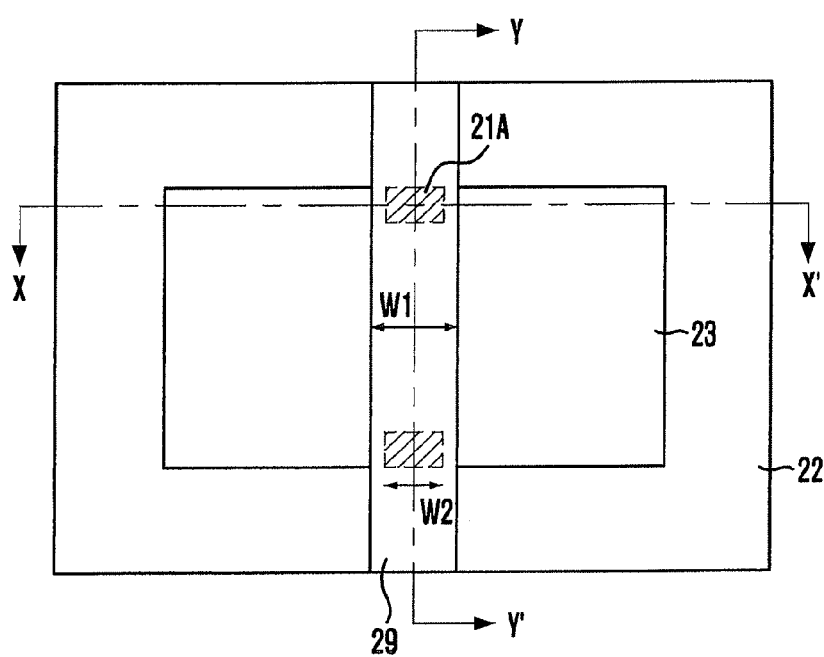
FIG. 2A illustrates a plan view of a semiconductor device in accordance with an embodiment of the present invention.
Figure 2B:
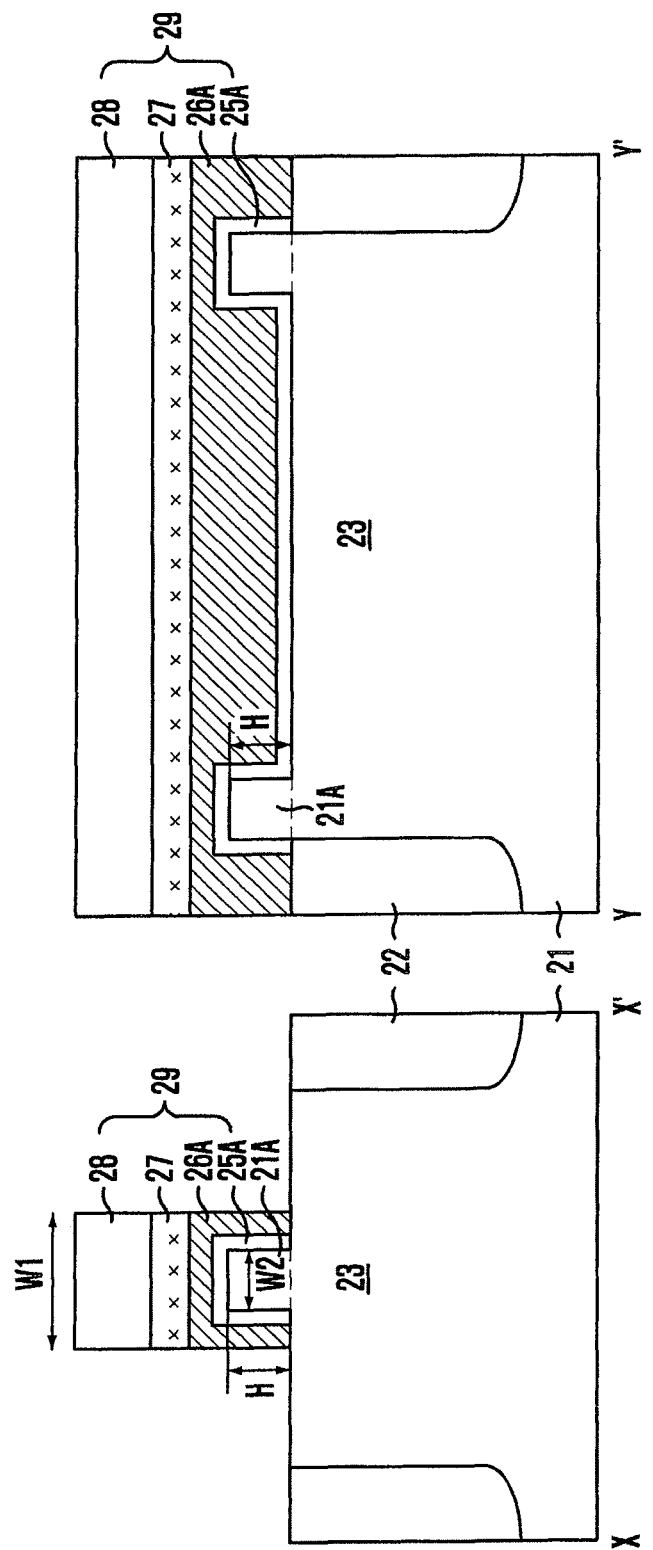
FIG. 2B illustrates a cross-sectional view of a semiconductor device in accordance with an embodiment of the present invention, taken along the line X-X' and the line Y-Y' of FIG. 2A.

FIG. 2A illustrates a plan view of a semiconductor device in accordance with an embodiment of the present invention, and FIG. 2B illustrates a cross-sectional view of a semiconductor device in accordance with an embodiment of the present invention, taken along the line X-X' and the line Y-Y' of FIG. 2A.

Referring to FIGS. 2A and 2B, the semiconductor device includes a gate pattern 29 crossing an active region 23 and an isolation region 22 with both over a substrate 21. It also includes a protrusion 21A having a surface higher than that of the substrate 21 in at least an edge of the active region 23 and contacting a portion of the isolation region 22 under the gate pattern 29.

The protrusion 21A may be a portion of the substrate 21 corresponding to the edge of the active region 23 contacting the isolation region 22, or a portion of the substrate 21 corresponding to a boundary between the isolation region 22 and the active region 23. The protrusion 21A may have a three-dimensional structure, that is, a cube shape or a rectangular parallelepiped shape.

The width W2 of the protrusion 21A may be formed smaller than the width W1 of the gate pattern 29 so that the gate pattern 29 may include the protrusion 21A. The height H of the protrusion 21A may be formed greater than the width W1 of the gate pattern 29 to increase a channel length at the edge of the active region 23 contacting the isolation region 22 under the gate pattern 29.

The channel length at the edge of the active region 23 contacting a portion of the isolation region 22 under the gate pattern 29 is described in more detail below.

The channel length of the gate pattern 29 formed in the central portion of the active region 23 is the same as the width W1 of the gate pattern 29. A channel length at the boundary between the active region 23 and the isolation region 22 where a hot electron induced punch through (HEIP) phenomenon occurs is formed along the surface of the protrusion 21A, so that the channel length is a value obtained by adding the height H of the protrusion 21A two times to the width W2 of the protrusion 21A. Therefore, since the channel length at the edge of the active region 23 is longer than the channel length at the central portion of the active region 23, a reduced effective channel length due to an HEIP phenomenon at the edge of the active region 23 contacting a portion of the isolation region 22 under the gate pattern 29 is compensated for.

The gate pattern 29 may include a gate insulation layer pattern 25A covering the surface of the protrusion 21A, a gate electrode formed over the gate insulation layer pattern 25A, and a gate hard mask layer 28 formed over the gate electrode. At this point, the gate insulation layer pattern 25A may be a silicon oxide layer.

The gate electrode may be formed in a structure in which a first gate conductive layer 26A and a second gate conductive layer 27 are stacked. Each of the first gate conductive layer 26A and the second gate conductive layer 27 may be one of a polysilicon layer, a metal layer (e.g., a Ti layer and a W layer), a conductive metal nitride layer (e.g., a TiN layer), a metal silicide layer (e.g., a titanium silicide layer and a tungsten silicide layer), and a stacked layer including a combination of these layers. The first gate conductive layer 26A may be formed using the gate insulation layer pattern 25A, for example, a silicon oxide layer and a polysilicon layer having an excellent interface characteristic. The second gate conductive layer 27 may be formed using one of a metal layer having an excellent electrical conductivity, a conductive metal nitride layer, or a metal silicide layer.

The gate hard mask layer 28 may be one of an oxide layer, a nitride layer, an oxynitride layer, a carbon containing layer, and a stacked layer including a combination of these layers. For example, the oxide layer may be one of a silicon oxide ($SiO_2$) layer, boron phosphorus silicate glass (BPSG), phosphorus silicate glass (PSG), tetra ethyle ortho silicate (TEOS), un-doped silicate glass (USG), spin on glass (SOG), high density plasma (HDP), and spin on dielectric (SOD). The nitride layer may be a silicon nitride layer ($Si_3N_4$). The carbon containing layer may be one of an amorphous carbon layer (ACL) and a carbon rich polymer layer.

As descried above, the present invention may relieve the HEIP phenomenon even without using a gate tap by forming the protrusion 21A of the three-dimensional structure over the edge of the active region 23 contacting the portion of the isolation region 22 under the gate pattern 29, or the boundary region between the isolation region 22 and the active region 23 under the gate pattern 29 where the HEIP phenomenon occurs to increase the channel length.

Also, the present invention may relieve the HEIP phenomenon even without using a gate tap, thereby reducing a net die size. Accordingly, the productivity of a semiconductor device may be improved.

Also, since a gate insulation layer pattern 25A is formed over a protrusion surface in accordance with the present invention, deterioration of the characteristic of the gate insulation layer pattern 25A due to a moat formed over the edge of the isolation region 22 contacting the active region 23 is prevented. That is, limitations (e.g., a hump) and a leakage current generated by a thinly formed gate insulation layer pattern 25A in a region where a moat is formed in a typical semiconductor device may be prevented.

Figure 3A:
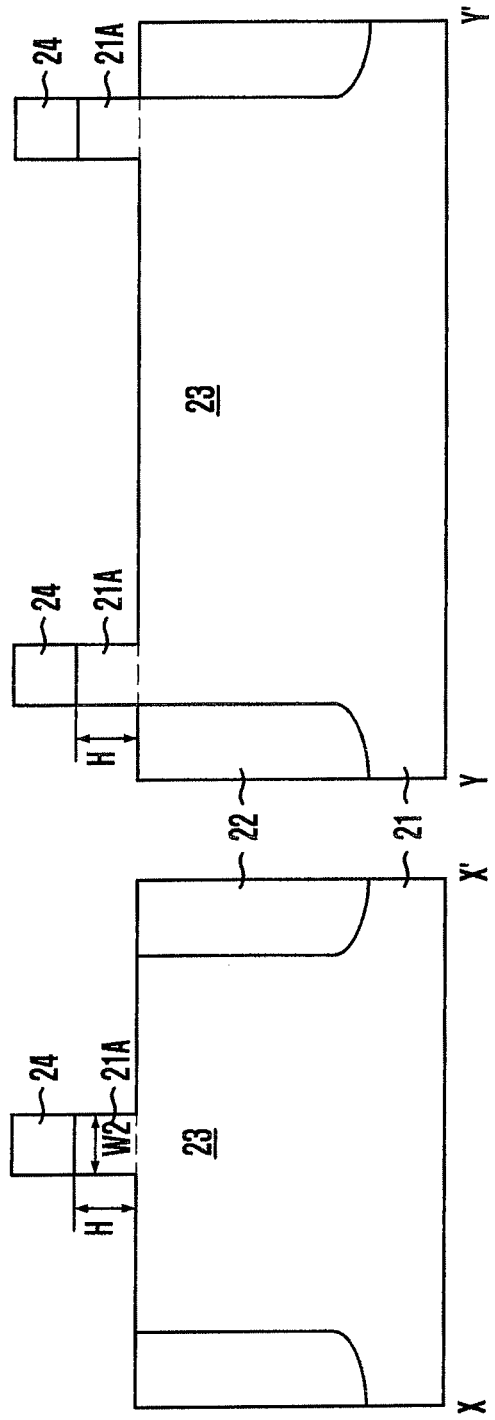
FIGS. 3A to 3C illustrate a method for fabricating a semiconductor device in accordance with an embodiment of the present invention, taken along the lines X-X' and Y-Y' of FIG. 2A.
Figure 3B:
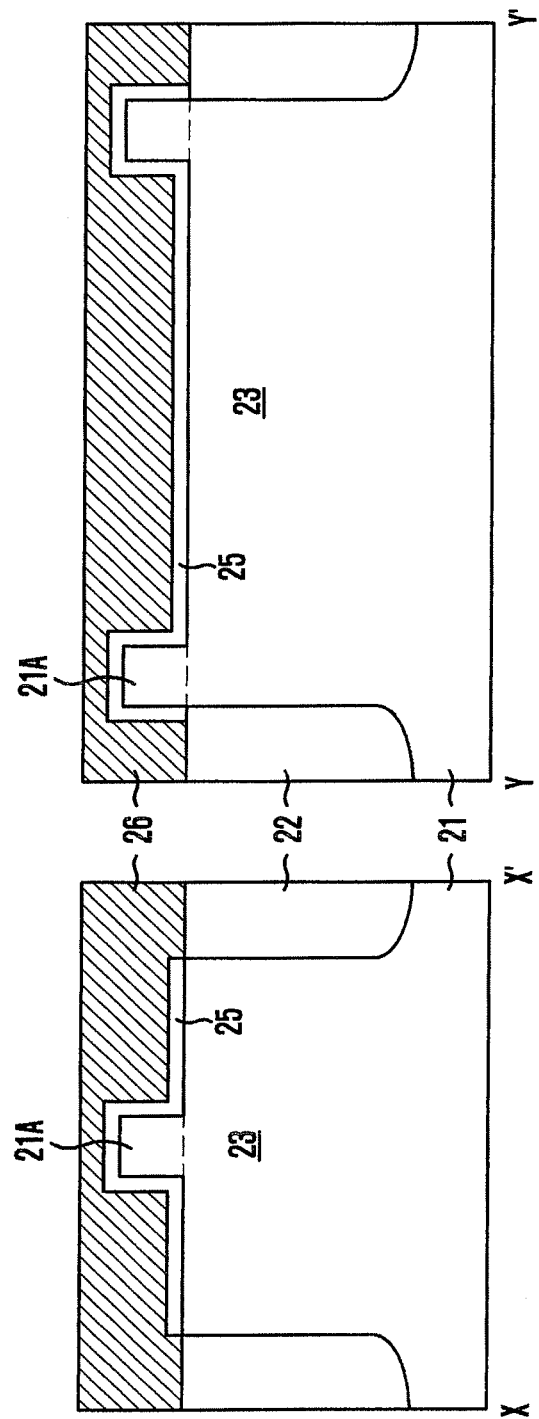
Figure 3C:
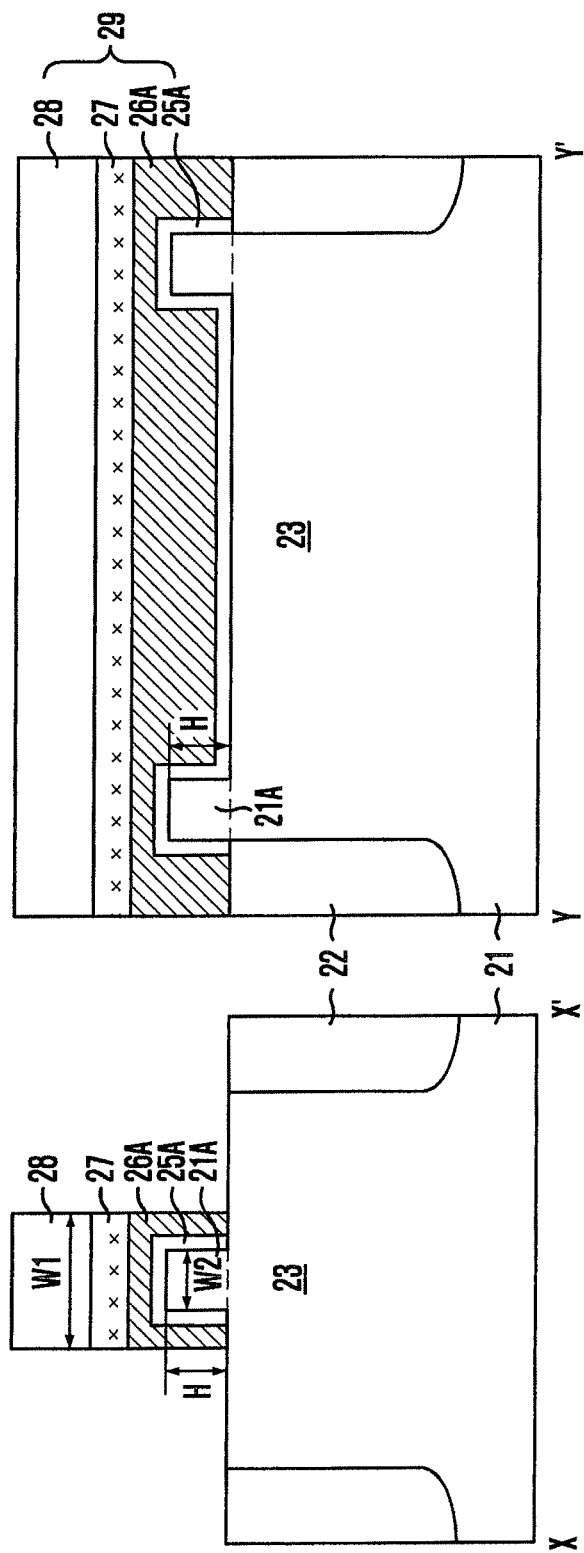

FIGS. 3A to 3C illustrate a method for fabricating a semiconductor device in accordance with an embodiment of the present invention, taken along the lines X-X' and Y-Y' of FIG. 2A.

Referring to FIG. 3A, hard mask patterns (not shown) including a pad oxide layer (not shown) and a pad nitride layer (not shown) are formed over the substrate 21, and the substrate 21 is etched using the hard mask patterns as an etch barrier (or etch mask) to form a trench.

A sidewall oxide layer (not shown), a liner nitride layer (not shown), and a liner oxide layer (not shown) are sequentially formed over the surface of the trench, and a dielectric for an isolation layer is formed to fill the trench.

The dielectric for the isolation layer is planarized using chemical mechanical polishing (CMP) to expose the pad nitride layer, and the hard mask patterns are removed to form the isolation region 22. At this point, though not shown in the drawing, a moat is formed at the edge of the isolation region 22 contacting the active region 23 while portions of the sidewall oxide layer and the liner nitride layer are lost during a process of removing the hard mask patterns.

A portion of the substrate 21 excluding a region where the isolation region 22 has been formed is defined as the active region 23.

Hard mask patterns 24 are formed over the substrate 21 including the isolation region 22 and the active region 23, and the substrate 21 is etched using the hard mask patterns 24 as an etch barrier to form the protrusion 21A having a higher surface than that of the substrate 21 at the edge of the active region 23 contacting the isolation region 22. Also, the protrusion 21A may be formed in the boundary region between the isolation region 22 and the active region 23.

The protrusion 21A plays the same role as that of the typical gate tap, and may be formed such that its height H is greater than its width W2 to secure a required channel length through a subsequent process.

Referring to FIG. 3B, a gate insulation layer 25 is formed over the entire surface of the substrate 21 including the protrusion 21A. At this point, the gate insulation layer 25 may be formed using a silicon oxide layer through thermal oxidation. Since the gate insulation layer 25 is formed over the surface of the protrusion 21A, it is not influenced by the moat formed in a portion of the isolation region 22 contacting the active region 23. Generally, the gate insulation layer 25 formed in a region where a moat is generated is formed thin due to a sharp shape of the moat, and accordingly, has been considered as a reason for generating limitations such as a hump and a leakage current.

A first gate conductive layer 26 is formed over the gate insulation layer 25 to cover the protrusion 21A. At this point, the first gate conductive layer 26 may be formed using the gate insulation layer 25, for example, a silicon oxide layer and a polysilicon layer having an excellent interface characteristic.

A planarization process is performed to remove a height difference of the first gate conductive layer 26 caused by the protrusion 21A. At this point, the planarization process may be performed using CMP.

Referring to FIG. 3C, a second gate conductive layer 27 is formed over the first gate conductive layer 26. At this point, the second conductive layer 27 may be one of a metal layer (e.g., a W layer and a Ni layer having excellent conductivity compared to the first gate conductive layer 26), a conductive metal nitride layer (e.g., a TiN layer), a metal silicide layer (e.g., a tungsten silicide layer and a nickel silicide layer), and a stacked layer including a combination of these layers.

The gate hard mask layer 28 is formed over the second gate conductive layer 27. At this point, the gate hard mask layer 28 may be one of an oxide layer, a nitride layer, an oxynitride layer, a carbon containing layer, and a stacked layer including a combination thereof.

Hard mask patterns (not shown) are formed over the gate hard mask layer 28, and the gate hard mask layer 28, the second gate conductive layer 27, the first gate conductive layer 26, and the gate insulation layer 25 are sequentially etched using the hard mask patterns as an etch barrier. Through this process, the gate insulation layer pattern 25A covering the surface of the protrusion 21A, a gate electrode in which the first gate conductive layer 26A and the second gate conductive layer 27 are stacked, and a gate pattern 29 in which the gate hard mask layer 28 formed over the gate electrode is stacked, may be formed.

As described above, the present invention may relieve the HEIP phenomenon even without using a gate tap by forming the protrusion 21A of the three-dimensional structure over the edge of the active region 23 contacting the portion of the isolation region 22 under the gate pattern 29, or the boundary region between the isolation region 22 and the active region 23 under the gate pattern 29 where the HEIP phenomenon occurs to increase the channel length.

Also, the present invention may relieve the HEIP phenomenon even without using a gate tap, thereby improving degree of integration of a semiconductor device. Accordingly, the productivity of a semiconductor device may be improved.

Also, since the gate insulation layer pattern 25A is formed over the surface of the protrusion 21A in accordance with the present invention, deterioration of the electrical characteristic of a semiconductor device due to a moat formed over the edge of an isolation region contacting an active region is prevented.

In accordance with the present invention, the protrusion of a three-dimensional structure is formed in the edge of an active region contacting a portion of an isolation region under a gate pattern, or a boundary region between a portion of the isolation region and a portion of the active region under the gate pattern where an HEIP phenomenon occurs to increase a channel length, so that the HEIP phenomenon may be relieved even without using a gate tap.

Also, since the HEIP phenomenon may be relieved even without a gate tap in accordance with the present invention, the degree of integration of a semiconductor device may be improved and thus productivity of a semiconductor device is improved.

Also, since a gate insulation layer is formed over a protrusion surface in accordance with the present invention, deterioration of the electrical characteristic of a semiconductor device due to moat formed over the edge of an isolation region contacting an active region is prevented.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A semiconductor device, comprising:
a substrate having an active region and an isolation region;
a gate pattern crossing both the active region and the isolation region of the substrate; and
a protrusion under the gate pattern and having a surface higher than that of the substrate, the protrusion being disposed over an edge of the active region contacting a portion of the isolation region;
wherein no protrusion exists in the active region that is not disposed over an edge of the active region contacting a portion of the isolation region;
wherein an upper surface of the active region adjacent the protrusion is at an elevation not lower than an elevation of an upper surface of the isolation region.

2. The semiconductor device of claim 1, wherein the protrusion extends up at a portion of the isolation region that contacts a portion of the active region under pattern.

3. The semiconductor device of claim 2, wherein a width of the protrusion is smaller than that of the gate pattern.

4. The semiconductor device of claim 2, wherein a height of the protrusion is greater than a width of the gate pattern.

5. The semiconductor device of claim 2, wherein the protrusion has a shape of cube or rectangular parallelepiped.

6. The semiconductor device of claim 2, wherein the gate pattern comprises:
a gate insulation layer covering a surface of the protrusion;
a gate electrode formed over the gate insulation layer; and
a gate hard mask layer formed over the gate electrode.

7. The semiconductor device of claim 1, wherein a width of the protrusion is smaller than that of the gate pattern.

8. The semiconductor device of claim 1, wherein a height of the protrusion is greater than a width of the gate pattern.

9. The semiconductor device of claim 1, wherein the protrusion has a shape of cube or rectangular parallelepiped.

10. The semiconductor device of claim 1, wherein the gate pattern comprises:
a gate insulation layer covering a surface of the protrusion;
a gate electrode formed over the gate insulation layer; and
a gate hard mask layer formed over the gate electrode.

11. The semiconductor device of claim 1, further comprising source and drain regions disposed in the active region on opposite sides of the gate pattern, wherein upper surfaces of the source and drain regions are at a lower elevation than the higher surface of the protrusion.

12. The semiconductor device of claim 1, wherein the gate pattern is characterized by a planer upper surface extending over the active region and the isolation region.

13. A semiconductor device, comprising:
a substrate having an active region and an isolation region;
a gate pattern crossing both the active region and the isolation region of the substrate; and
first and second protrusions under the gate pattern and having a surface higher than that of the substrate, wherein the first protrusion is disposed over a first edge of the active region contacting a first portion of the isolation region, and the second protrusion is disposed over a second edge of the active region contacting a second portion of the isolation region, wherein no protrusions are disposed in the active region between the first and the second protrusions;
source and drain regions disposed in the active region on opposite sides of the gate pattern, wherein upper surfaces of the source and drain regions are at a lower elevation than the higher surface of the protrusion.

14. The semiconductor device of claim 13, wherein an upper surface of the active region between the first and the second protrusions is at an elevation not lower than an elevation of an upper surface of the isolation region.

15. The semiconductor device of claim 13, wherein the gate pattern is characterized by a planer upper surface extending over the active region and the isolation region.

* * * * *